(12) United States Patent
Boswell et al.

(10) Patent No.: US 8,922,957 B2
(45) Date of Patent: Dec. 30, 2014

(54) DYNAMIC SWITCH CONTACT PROTECTION

(75) Inventors: Bryan D. Boswell, Loveland, CO (US); Robert Wayne Leiby, Fort Collins, CO (US); Steven J. Narciso, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1980 days.

(21) Appl. No.: 12/113,196

(22) Filed: Apr. 30, 2008

(65) Prior Publication Data
US 2009/0274051 A1   Nov. 5, 2009

(51) Int. Cl.
  *H02H 7/22* (2006.01)
  *H02H 9/00* (2006.01)
  *G01R 31/28* (2006.01)
(52) U.S. Cl.
  CPC .............. *H02H 9/001* (2013.01); *G01R 31/28* (2013.01)
  USPC .............................................. 361/3
(58) Field of Classification Search
  USPC .............................................. 361/13, 3, 8–10
  See application file for complete search history.

(56) References Cited

U.S. PATENT DOCUMENTS

| | | | | |
|---|---|---|---|---|
| 3,249,810 A | * | 5/1966 | Strom et al. | 361/3 |
| 3,529,210 A | * | 9/1970 | Toshio et al. | 361/58 |
| 3,590,319 A | * | 6/1971 | Baltensperger | 361/8 |
| 3,639,808 A | * | 2/1972 | Ritzow | 361/13 |
| 3,809,959 A | * | 5/1974 | Pucher | 361/8 |
| 3,982,137 A | * | 9/1976 | Penrod | 361/8 |
| 4,847,719 A | * | 7/1989 | Cook et al. | 361/13 |
| 5,953,189 A | * | 9/1999 | Abot et al. | 361/13 |
| 2003/0137786 A1 | * | 7/2003 | Hasegawa et al. | 361/10 |
| 2004/0255216 A1 | * | 12/2004 | Ichiyoshi | 714/742 |
| 2007/0296401 A1 | * | 12/2007 | Reimund et al. | 324/158.1 |
| 2009/0309547 A1 | * | 12/2009 | Nakatsuji | 320/134 |

* cited by examiner

*Primary Examiner* — Rexford Barnie
*Assistant Examiner* — Ann Hoang

(57) ABSTRACT

A dynamic switch contact protection circuit and technique to protect a channel switch within an electrical system by limiting transients when the switch is turned on or turned off. The protection circuit comprises switching between a high resistance path and a low resistance path. The high resistance path comprises a resistor. A bypass switch is connected in parallel to the resistor to affect the low resistance path. The protection circuit can connect or disconnect switch cards to the electrical system enabling the creation of a larger switching structure. Disconnected switch cards within a switching structure preserves system bandwidth by limiting capacitive loading. Electing which switch to close last or open first can prolong the length of usage of the switches.

20 Claims, 5 Drawing Sheets

DYNAMIC SWITCH CONTACT PROTECTION

BACKGROUND OF THE INVENTION

Various types of switches are used in electronic test and measurement systems to switch or route signals between a stimulus, measuring instruments, and devices-under-test (DUTs). Often the switches that switch the fastest at the lowest currents and voltages have physical contacts that are susceptible to damage. Damage, or abuse, can be the result of electrical transient effects that occur during the make or break cycle of the switch. Measurement can be defined as the process of testing or exercising a circuit using both sources and detectors.

Switches common in the art are reed relays, armature relays, and electronic or solid-state switches.

Reed relays are used in switching platforms that employ thousands of such switches. Replacing thousands of relays at regular intervals or replacing selected worn out relays is an undesirable expense.

While these switch contacts can be protected by the use of current-limiting resistors in the path of the switch, the resistors sometimes add undesired impedance to a circuit.

A majority of the abuse happens to the switch closed last and the switch opened first for a given circuit. The abuse mechanism is different in each case. The mechanism on closure results from a voltage differential across the open contacts. As the switch closes, very high currents can flow from circuit capacitances damaging the switch. Damage on switch closure is due primarily to an excessive surge in current, also called in-rush current. This occurs when the voltage across the contacts equalizes while the instrument and channel capacitances charge or discharge. Small micro-welds develop on the surface of the switch contacts over time and the contacts become irregular and pitted. Subsequently, the contacts develop a higher resistance. Catastrophic failure during closure for most switches is a stuck close condition.

Damage on opening the switch is due primarily to an excessive surge in voltage causing arcing. Current flowing through the inductance of a closed circuit path cannot change instantaneously. As the switch opens, an arc forms to dissipate the energy stored in the inductance. This arc also damages the switch contacts. This arc causes contact pitting in relays as the contacts separate due to excessive power and heat in a very small area. Contact resistance for relays will typically continue to increase as they are repeatedly subjected to arcing. There is no typical failure mode for solid-state switches subjected to an arc, but it can be catastrophic.

One method limiting the in-rush current is to place series resistance in the switch circuit. However many applications cannot accommodate fixed resistance in the path of the switch however. Some switch cards provide both current limited and non-current limited channels while other cards provide methods defeating the current limit on selected channels by installing shorts across the current-limit resistors. Other methods of minimizing in-rush current include minimizing the voltage difference or reducing the capacitance across the open switch contacts, neither of which may be practical. Increasing the series resistance of the path decreases the peak current. This decrease in current lessens the energy stored by the inductance by the square of the current and minimizes the damage. Techniques for minimizing arcing include minimizing the circuit inductance and adding "snubber circuits" across the contacts. Snubbers are circuits that provide a transient path for the current flow immediately after the circuit is opened. Snubbers are common for switching involving high current and/or large inductance, but they are not a universal solution. They place a large residual capacitance across the switch contacts that results in in-rush current on closure and a frequency-dependent leakage path when the switch is open.

Configuring switch cards to form a larger switching structure is desirable when designing large systems using modular blocks. Merely adding additional switching structures in parallel can cause a problem with the additional loading the switches represent. Not all switch cards provide a feature to connect and disconnect a switch card (channel switching structure) to or from the electrical system. In some cases, this option is not desirable as it doubles the number of switch contacts in series with the measuring instruments and the amount of cabling and interconnect required to add it often makes it prohibitive.

Accordingly, a need exists to prevent damage to switches without permanently adding resistance to the measurement path, and providing a feature to easily disconnect a switch card from the electrical system.

DETAILED DESCRIPTION

A dynamic switch contact protection ("dynamic protection") circuit and technique is described herewith as a solution to the problems described above. The dynamic protection comprises switching to a high resistance path to reduce the electrical transient effects when opening and closing a channel switch. The dynamic protection also comprises switching to a low resistance path for connecting the electronic devices through the channel switch for making measurements with the electronic devices. The dynamic protection further comprises disconnecting a channel switching structure to isolate the channel switching structure from the electrical system.

The dynamic protection technique uses a current-limiting resistor in series with the channel switch. The added resistance of the current-limiting resistor lessens the abuse (described above), thereby protecting the channel switches of the measurement path, and increasing their usable lifetimes. When sequenced, the technique provides current-limiting protection and low path impedance.

An embodiment of a dynamic protection circuit comprises two switches, and a current-limiting resistance. In addition to protecting the contacts of the channel switch, the technique also provides the ability to disconnect a sub-switching structure from the electrical system, thereby isolating the channel switches from the larger switching structure.

With dynamic protection, peak currents are limited, thereby reducing the abuse to the switch contacts. As described above, damage to switch contacts is manifested as welds for relays or punch-throughs on solid-state devices.

Making the protection dynamic allows the current-limiting resistor to be available during the switching, but eliminated during steady-state operation. As some circuit applications can operate with the current-limiting resistor, the solutions described within also support such a condition.

Figure 1:
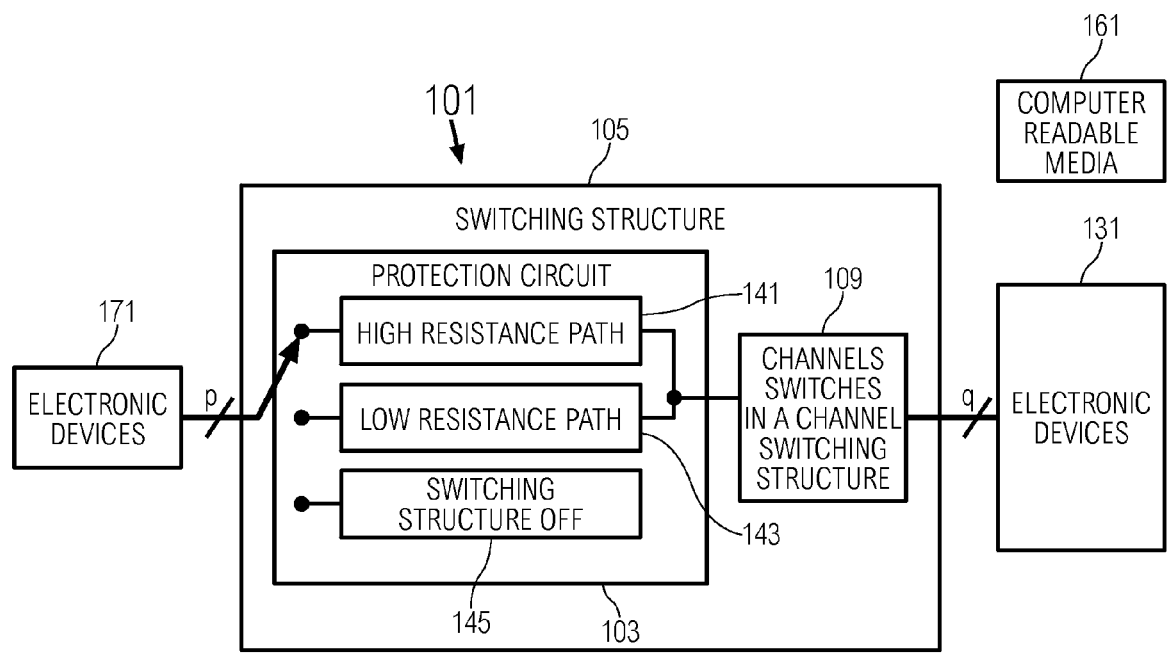
FIG. 1 is a diagrammatic representation of an electrical system incorporating a dynamic protection circuit.

FIG. 1 is a diagrammatic representation of an electrical system 101 comprising electronic devices 171, a switching structure 105, and second group of electronic devices 131. The switching structure 105 comprises a dynamic protection circuit 103 and a channel switching structure 109. The channel switching structure 109 comprises an array of channel switches (not shown). The electronic devices 171 can be measuring instruments and second group of electronic devices 131 can be DUTs.

The electronic devices 171 are connected to the protection circuit 103 of the switching structure 105 via a wire bus of size p. The channel switches in the channel switching structure 109 are connected to the second group of electronic devices 131 via a wire bus of size q. Generally, the electrical system 101 can accommodate 1-to-many, many-to-1, 1-to-1, or many-to-many switching configurations.

The protection circuit 103 identifies three paths of the dynamic protection technique; a path of high resistance 141, a low resistance path 143, and a state 145 that disconnects the switching structure 105 from the electrical system 101. A measurement path is defined as a path from one electronic device 171 through the protection circuit 103, through a channel switch in the channel switching structure 109 and to a second electronic device 131. Measurement paths can encompass more than one channel switch.

FIG. 1 also describes computer readable media 161 containing code for providing instructions to and for execution by the electrical system 101. The computer readable media 161 can be, for example, a ROM, a RAM, a DVD, a hard drive, or other computer readable media known in the art. The instructions are embedded in firmware to control the sequence of switches in the dynamic protection circuit 103 and the channel switches in the channel switching structure 109.

Figure 2:
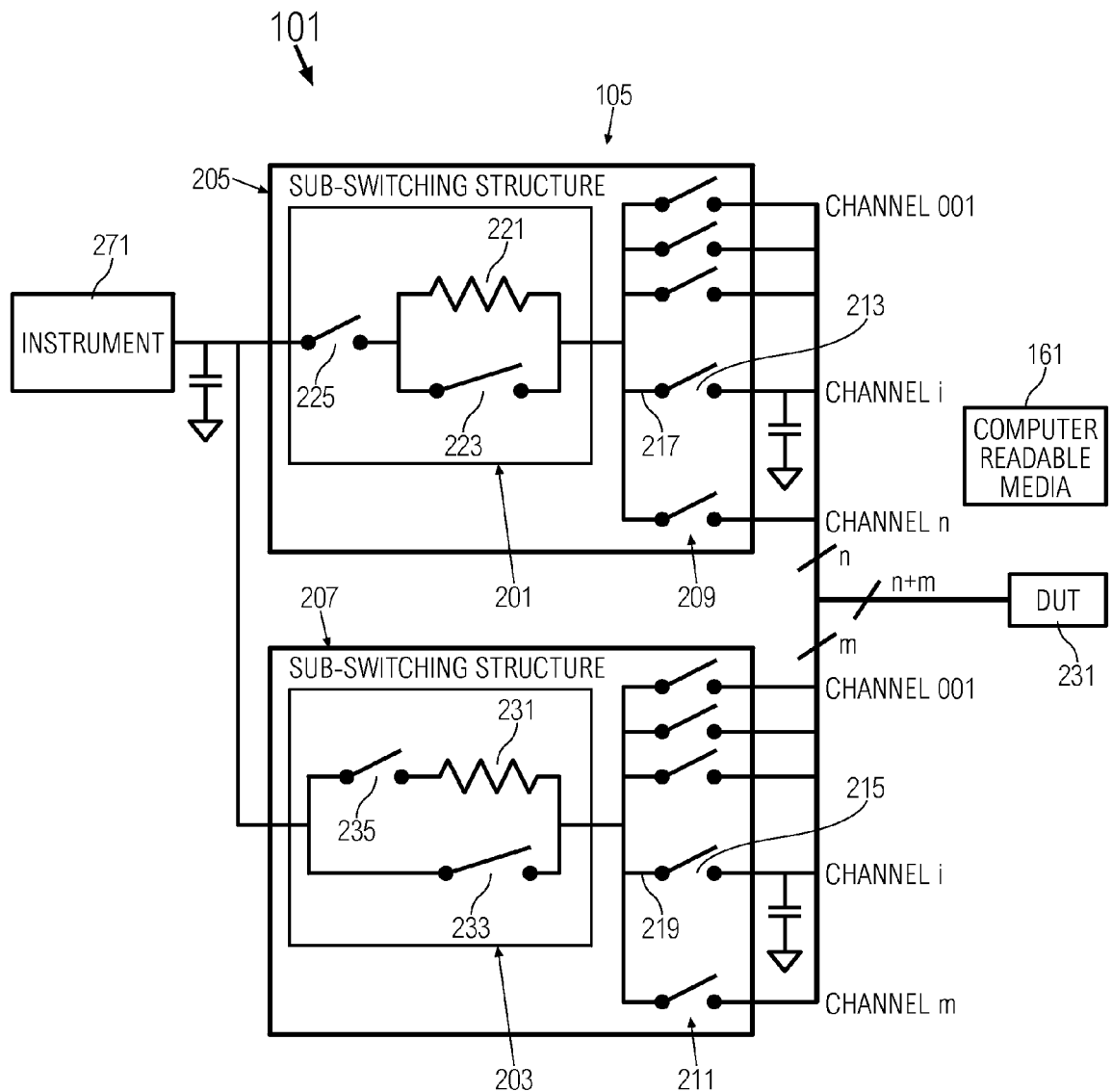
FIG. 2 is a schematic of dynamic protection circuit embodiments within the electrical system.

FIG. 2 is a schematic of the electrical system 101 of FIG. 1. The electrical system 101 in FIG. 2 comprises a measuring instrument 271, and two sub-switching structures 205 and 207 within the switching structure 105. The sub-switching structures each have a channel switching structure 209 and 211. The channel switching structure 209 comprises n channels of at least n switches. Similarly, the channel switching structure 211 comprises m channels of at least m switches. Channel switches 213 and 215 are individual switches identified as Channel i in the channel switching structures 209 and 211 respectively.

A DUT 231 is connected to the output of the channel switching structures 209 and 211 via a wire bus of size of n+m. The sub-switching structures 205 and 207 in FIG. 2 have been configured within a larger switching structure 105 to increase the number of channel switches connectable to the DUT 231. The electrical system 101 has the flexibility of disconnecting the sub-switching structures 205 and 207 so as not to affect bandwidth performance (described in detail later).

Two embodiments of the dynamic protection circuits 103 of FIG. 1 exist in FIG. 2, one in each sub-switching structure 205 and 207. The dynamic protection circuits 201 and 203 each comprise two protection switches and a current-limiting resistor. The current-limiting resistor can typically be 50 Ohms, 100 Ohms, 1 kOhm or larger, to limit in-rush current.

The protection circuit 201 has a circuit topology wherein a current-limiting resistor 221 and a bypass switch 223 are connected in parallel. A common switch 225 is connected in series with the parallel components.

The protection circuit 203 has a circuit topology wherein a common switch 235 connected in series with a current-limiting resistor 231. A bypass switch 233 connected in parallel with the series components.

Figure 3:
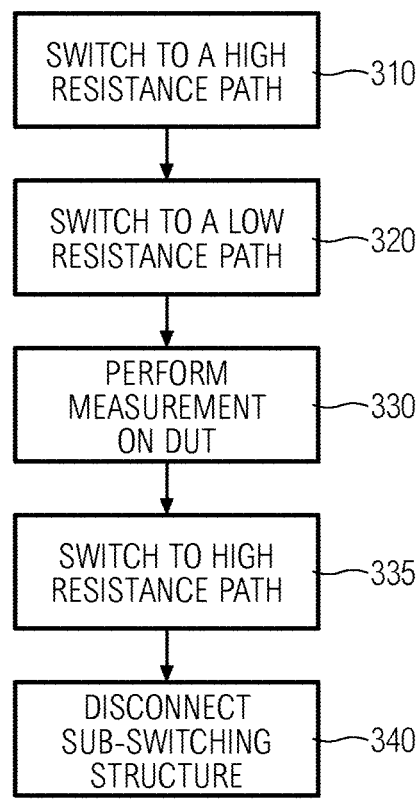
FIG. 3 is a flow chart showing steps for operating the dynamic protection circuit.
Figure 4:
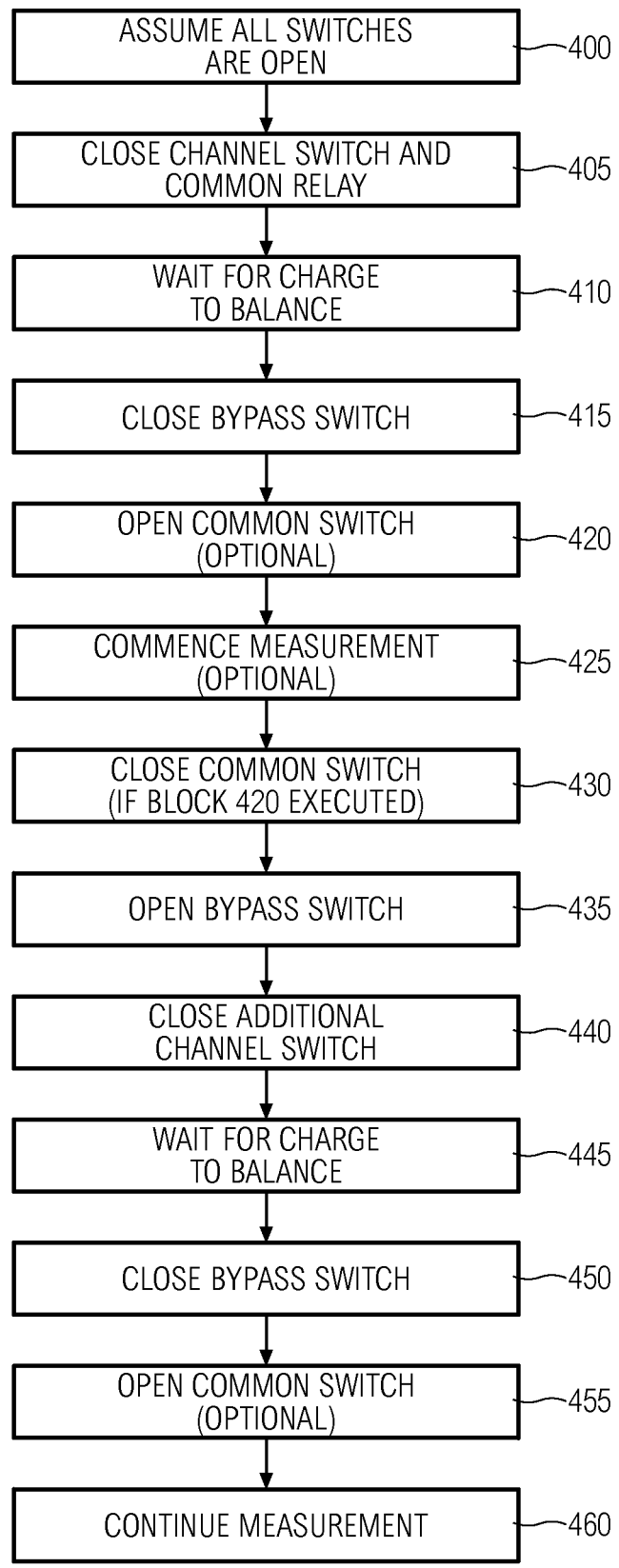
FIG. 4 is a flow chart showing steps on using the dynamic protection to close a channel switch within an electrical system.
Figure 5:
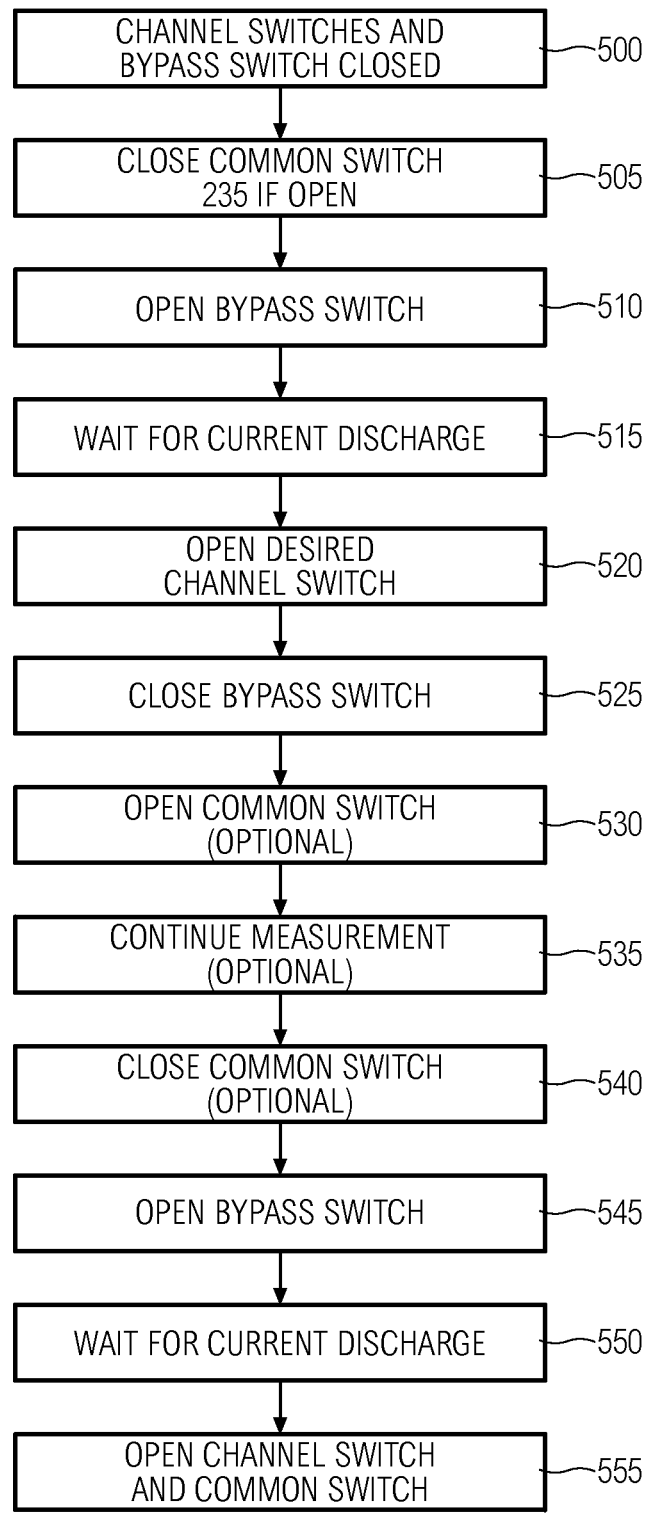
FIG. 5 is a flow chart showing steps on using the dynamic protection to open a channel switch within an electrical system.

FIGS. 3, 4 and 5 are flow charts showing steps for operating the dynamic protection circuits. FIG. 3 is an overview of the dynamic protection technique and corresponds to FIG. 1. FIGS. 4 and 5 provide a detailed flow of the dynamic protection technique corresponding to the protection circuits 201 and 203 of FIG. 2.

In FIG. 3, Block 310 describes switching the measurement path to a high resistance path 141 to reduce the electrical transient effects when opening and closing a channel switch within the channel switching structure 109. When the high resistance path 141 is selected, the sub-switching structure is configured into the switching structure 105 of the electrical system 101. This is also referred to as the high resistance state.

Block 320 describes switching to the low resistance path 143 for connecting the electronic devices 171 through the channel switch for making measurements with the second group of electronic devices 131. When the low resistance path 143 is selected, the switching structure 105 is configured into the electrical system 101. This is also referred to as the low resistance state.

Block 330 describes performing measurements on the DUT.

Block 335 describes connecting to the high resistance path 141 to prepare either to open a channel switch or to disconnect a sub-switching structure from the switching structure 105.

Block 340 describes disconnecting the channel switching structure 109 (or sub-switching structure) from the switching structure 105 of the electrical system 101. This is described in further detail below. This is also referred to as the disconnected state.

FIGS. 4 and 5 are flow charts describing steps of applying the dynamic protection technique corresponding to the two embodiments shown in FIG. 2. These steps can be executed manually or by an automated process. The sequence of operation to close a measurement path is illustrated in FIG. 4. The sequence of operation to open a measurement path is illustrated in FIG. 5.

A measurement path 217 or 219 is identified in general nomenclature by Channel i 213 and 215. The descriptions that follow identify steps for turning on (FIG. 4) and turning off (FIG. 5) the channel switch Channel i 213 and measurement path 217 of the first sub-switching structure 205. Comments for the channel switch Channel i 215 and the measurement path 219 of the second sub-switching structure 207 are in parenthesis, unless where noted otherwise.

In FIG. 4, Block 400 describes a state wherein all switches in the channels channel switching structure 209 (or 211) are open and the sub-switching 205 (or 207) is in a disconnected state.

Block 405 describes introducing the current-limiting resistor 221 (or 231) into the measurement path. This can be achieved by closing the channel switch 213 (or 215) and the common switch 225 (or 235) to enter the high resistance state.

Block 410 describes waiting a measured time to allow the voltage on the instrument 271 and associated capacitance to charge (or discharge) to the voltage on the DUT 231 and associated capacitance through the established measurement path 217 (or 219) of the channel switch 213 (or 215), current limiting resistor 221 (or 231), and the common switch 225 (or 235).

The circuit can be modeled as a pair of charged capacitors interconnected by a series resistance that exhibits a welldefined exponential voltage charge/discharge model. However, the wait time associated with this step is rarely calculated. The actual capacitances, voltages, and resistance usually may not be known, and an estimate to produce a nominal wait time sufficient to safely enter the low resistance state is acceptable.

Block 415 describes closing the bypass switch 223 (or 233) to bypass current around the current-limiting resistor 221 (or 231) to enter the low resistance state (analogous to Block 320 of FIG. 3).

Block 420 describes an option of opening the common switch 235 of the second sub-switching structure 207 to minimize the power dissipation in the circuit.

Block 425 describes commencing the measurement on the channel using channel switch 213 (or 215), if desired.

Additional channel switches can be closed by repeatedly executing the following the steps of Blocks 430-460.

Block 430 describes closing the common switch 235 of the second sub-switching structure 207 if the step in Block 420 was executed.

Block 435 describes opening the bypass switch 223 (or 233) to enter the high resistance state.

Block 440 describes closing the additional channel switch 213 (or 215).

Block 445 describes waiting a sufficient amount of time to allow a charge balance to occur between the instrument 271 and additional channel capacitance through the current-limiting resistor 221 (or 231). Different channels have different amounts of capacitance associated with them, but typically all close to the same.

Block 450 describes closing the bypass switch 223 (or 233) around the current-limiting resistor 221 (or 231) to enter the low resistance state.

Block 455 describes an option of opening the common switch 235 of the second sub-switching structure 207 to minimize the power dissipation in the circuit.

Block 460 describes continuing measuring parts of the DUT 231 connected to the channel switches closed by the steps described above.

In FIG. 5, Block 500 identifies a state wherein measurements have recently been completed utilizing measurement paths set up by more than one channel switch. As measurements have recently concluded, the channel switches and bypass switch 223 (or 233) are presently closed. The closed channel switch(s) and the bypass switch represents the low resistance state.

Block 505 describes closing the common switch 235 of the second sub-switching structure 207 if the step in Block 420 or 455 was executed.

Block 510 describes opening the bypass switch 223 (or 233) to divert the channel current through the current-limiting resistor 221 (or 231) to enter the high resistance state.

Block 515 describes waiting a sufficient time to allow the inductance in the measurement circuit to discharge to a lower current through the current-limiting resistor 221 (or 231). Similar to the prior wait in Block 410, this time delay can also be accurately modeled as an exponential current decay, but is usually estimated or bounded to a nominal wait time sufficient to safely open the channel switch of the circuit.

Block 520 describes opening the desired channel switch 213 (or 215).

Block 525 describes closing the bypass switch 223 (or 233) to enter the low resistance state.

Block 530 describes an option of opening the common switch 235 of the second sub-switching structure 207 to minimize the power dissipation in the circuit.

The steps in Blocks 505-530 are repeated to open all but one of the remaining channel switches (that are closed).

The following steps describe actions to open the last channel switch 213 (or 215).

Block 535 describes continuing with measurements if required.

The following steps describe opening the last closed channel switch in the channel switching structure 209 (or 211). Block 540 describes closing the common switch 235 of the second sub-switching structure 207 if the step in Block 530 was executed.

Block 545 describes opening the bypass switch 223 (or 233) diverting the channel current through the current-limiting resistor 221 (or 231) to enter the high resistance state.

Block 550 describes waiting sufficient time to allow the inductance in the circuit to discharge to a lower current through the current-limiting resistor 221 (or 231).

Block 555 describes opening the desired channel switch 213 (or 215) and the common switch 225 (or 235), effectively disconnecting the channel switching structure 209 (or 211) and the sub-switching structure 205 (or 207), and entering the disconnected state. This last step provides detail to Block 340 of FIG. 3, wherein it describes disconnecting the channel switching structure 109 (or sub-switching structure) from the switching structure 105 of the electrical system 101.

The order of closing the common switch 225 (or 235) and the channel switch 213 (or 215) in Block 405 of FIG. 4 is an additional design measure to protect the contact points of the channel switch 213 (or 215) and the common switch 225 (or 235). In this instance, the switch closed last will bear the most abuse.

This sequence order can be implemented by firmware in an automated system. The firmware is stored on the computer readable media 161. Described above, the firmware can control the sequence of switches in the dynamic protection circuit 103 and the channel switches in the channel switching structure 109.

The abuse encountered during closure of switches can be focused on the common switch 225 (or 235) of the protection circuit 201 (or 203). With this decision, the common switch can be made more robust than the channel switches. They can subsequently be made easier to replace through initial design and preventative maintenance measures. Alternatively, this abuse can be distributed across the channel relays 217 (or 219) to yield uniform abuse across all the switches of the electrical system 101.

A similar consideration applies for opening the relevant switches (the channel switch 213 (or 215) and the common switch 225 (or 235)) when executing the steps in Block 555 of FIG. 5. In this instance, the switch opened first bears the most abuse.

The sub-switching structure 205 (or 207) of FIG. 2 is disconnected from the electrical system 101 by turning off the protection switches in the protection circuit 201 (or 203). This option preserves bandwidth performance (reduced loading) when connecting together (in parallel) multiple sub-switching structures 205 or 207. The bandwidth performance is preserved when the idle sub-switching structures 205 or 207 are disconnected from the electrical system 101. This is significant as large matrices or multiplexers could have many channel relays (for example 16, 32, or 64 switches) connected to the electronic devices 271 and 231. Without disconnecting an idle sub-switching structure, the unused channel switches would load the electrical system 101. This would lower the bandwidth performance due to capacitance loading.

Channels within the switching structure 105 can be configured in parallel to form a larger switching structure using the protection circuits 201 and 203 of FIG. 2. For example, four 1-to-16 multiplexers in a sub-switching structure can be configured as a 1-to-64 multiplexer by paralleling the channel switches in each multiplexer. This will have approximately the same performance as each 1-to-16 multiplexer as idle multiplexers can be disconnected when not in use.

Paralleling channels across multiple cards can also be configured as a larger switching structure using the protection circuits of FIG. 2. For example, four sub-switching structures, each with four 1-to-16 multiplexers, can first be configured as 1-to-64 multiplexer on each card, as shown above. Subsequently, the four sub-switching structures can be expanded to a 1-to-256 larger switching structure by paralleling the sub-switching structures. Similarly, the 1-to-256 measuring circuit can approximate the same performance as a single 1-to-16 multiplexer when the idle cards or are disconnected from the electrical system 101.

While the embodiments described above constitute exemplary embodiments of the invention, it should be recognized that the invention can be varied in numerous ways without departing from the scope thereof. It should be understood that the invention is only defined by the following claims.

The invention claimed is:

1. A method of protecting a channel switch in a channel switching structure selectively connecting electronic devices, the method comprising the steps of:
   switching to a high resistance path by closing a common switch arranged in series with a current limiting resistor;
   closing the channel switch to connect the electronic devices via the high resistance path while switched to the high resistance path for reducing electrical transient effects caused by closing the channel switch; and
   switching to a low resistance path after closing the channel switch by closing a bypass switch arranged in parallel with at least the current limiting resistor to connect the electronic devices via the low resistance path through the channel switch to bypass the current limiting resistor for making measurements with the electronic devices.

2. The method of claim 1, wherein one of the electronic devices is a measuring instrument and another of the electronic devices is a device under test.

3. The method of claim 1, further comprising:
   opening the common switch when closing the bypass switch to bypass the current limiting resistor.

4. The method of claim 1, wherein the step of switching to the high resistance path or low resistance path configures the channel switching structure into a larger switching structure.

5. The method of claim 1, further comprising:
   disconnecting the channel switching structure from a larger switching structure.

6. The method of claim 5, wherein disconnecting the channel switching structure from a larger switching structure comprises opening the common switch, the common switch being part of the high resistance path.

7. The method of claim 5, wherein the disconnecting the channel switching structure from a larger switching structure comprises opening the common switch and the bypass switch, the common switch being part of the high resistance path, and the bypass switch being part of the low resistance path.

8. The method of claim 1, wherein the step of closing the switch while switched to the high resistance path is performed according to a sequence stored in firmware.

9. The method of claim 1, further comprising:
   switching to the high resistance path by opening the bypass switch arranged in parallel with at least the current limiting resistor to connect the electronic devices via the high resistance path through the common switch; and
   opening the channel switch to disconnect the electronic devices via the high resistance path while switched to the high resistance path for reducing electrical transient effects caused by opening the channel switch.

10. An electrical system, comprising:
    a channel switch in a channel switching structure configured to close in order to connect electronic devices in the electrical system; and
    a protection circuit configured to switch to a high resistance path to reduce electrical transient effects when the channel switch closes, and to switch to a low resistance path after the channel switch closes to connect the electronic devices through the channel switch for making measurements with at least one of the electronic devices, wherein the protection circuit comprises:
      a common switch configured to close before the channel switch closes, forming the high resistance path by connecting the channel switch in series with a current limiting resistor, thereby reducing electrical transient effects caused by closing the channel switch; and
      a bypass-switch configured to close after the channel switch closes, forming the low resistance path by by-passing the current limiting resistor, for making the measurements with the at least one of the electronic device.

11. The electrical system of claim 10, wherein one of the electronic devices is a measuring instrument and another of the electronic devices is a device under test.

12. The electrical system of claim 10, wherein the switch is within a channel switching structure, and the channel switching structure being configured into the electrical system by switching to the high resistance path or the low resistance path.

13. The electrical system of claim 12, wherein the protection circuit is further configured to disconnect the channel switching structure from the electrical system by opening the common switch.

14. The electrical system of claim 10, wherein the protection circuit is further configured to switch to the high resistance path to reduce the electrical transient effects when the channel switch opens, and to switch to the low resistance path after the channel switch opens, the channel switch opening while the protection circuit is switched to the high resistance path.

15. The electrical system of claim 14, wherein the electrical transient effects when opening the channel switch result from a surge in voltage and the electrical transient effects when closing the channel switch result from a surge in current.

16. A switching structure arranged between an instrument and a device under test (DUT), comprising:
    a plurality of sub-switching structures, each sub-switching structure comprising:
      a channel switching structure comprising a plurality of channel switches configured to selectively connect the instrument and the DUT via a corresponding plurality of channels; and
      a protection circuit comprising:
        a current limiting resistor;
        a common switch arranged in series with the current limiting resistor and configured to close before closing at least one channel switch of the plurality of channel switches to form a high resistance path for reducing electrical transient effects caused by closing the at least one channel switch; and a bypass-switch arranged in parallel with at least the current limiting resistor and configured to close after closing the at least one channel switch to form a low resistance path for performing measurements on the DUT.

17. The switching structure of claim 16, wherein the common switch is further configured to connect the corresponding sub-switching structure from to the switching structure when closed, and to disconnect the corresponding sub-switching structure to the from the switching structure when opened for isolating the plurality of channel switches of the corresponding sub-switching structure from the switching structure.

18. The switching structure of claim 16, wherein the common switch is further configured to open after closing the at least one channel switch to form the low resistance path.

19. The switching structure of claim 18, wherein the common switch is further configured to close before opening the at least one channel switch to form the high resistance path for reducing electrical transient effects caused by subsequently opening the at least one channel switch.

20. The switching structure of claim 16, wherein the by-pass switch is further configured to open before opening the at least one channel switch to form the high resistance path for reducing electrical transient effects caused by subsequently opening the at least one channel switch.

* * * * *